(12) United States Patent
Stavely et al.

(10) Patent No.: US 7,679,647 B2
(45) Date of Patent: Mar. 16, 2010

(54) FLEXIBLE SUSPENSION FOR IMAGE STABILIZATION

(75) Inventors: Donald J. Stavely, Windsor, CO (US); Robert D Bolinder, III, Fort Collins, CO (US); Theodore B. Ziemkowski, Loveland, CO (US); Jeffrey P Baker, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1111 days.

(21) Appl. No.: 10/896,470

(22) Filed: Jul. 21, 2004

(65) Prior Publication Data

US 2006/0017815 A1    Jan. 26, 2006

(51) Int. Cl.
*H04N 5/2228* (2006.01)

(52) U.S. Cl. .............................. 348/208.99; 348/208.7; 396/55

(58) Field of Classification Search .............. 348/208.4, 348/208.99–208.16; 396/55
See application file for complete search history.

(56) References Cited

U.S. PATENT DOCUMENTS

| 4,448,510 A | | 5/1984 | Murakoshi |
| 4,704,568 A | * | 11/1987 | Beck et al. .................. 318/687 |
| 4,927,164 A | * | 5/1990 | Raj et al. .................... 277/410 |
| 5,219,640 A | * | 6/1993 | Gazit et al. ................. 428/209 |
| 5,220,223 A | * | 6/1993 | Mehnert ....................... 310/14 |
| 5,266,988 A | | 11/1993 | Washisu |
| 5,460,341 A | * | 10/1995 | Katsuyama et al. ....... 244/118.1 |
| 5,461,272 A | * | 10/1995 | Matsumoto .................. 310/309 |
| 5,774,266 A | | 6/1998 | Otani et al. |
| 5,943,512 A | | 8/1999 | Hamada et al. |
| 5,946,189 A | * | 8/1999 | Koenen et al. .............. 361/698 |
| 6,047,133 A | * | 4/2000 | Washisu et al. ............... 396/55 |
| 6,101,332 A | | 8/2000 | Satoh |
| 6,263,160 B1 | * | 7/2001 | Lewis ........................... 396/13 |
| 6,301,440 B1 | | 10/2001 | Bolle et al. |
| 6,400,902 B1 | * | 6/2002 | Usui ............................ 396/55 |
| 6,798,984 B2 | * | 9/2004 | Antikidis ....................... 396/13 |
| 6,992,700 B1 | * | 1/2006 | Sato et al. ................ 348/208.2 |
| 7,161,621 B2 | | 1/2007 | Kai et al. |
| 2003/0076421 A1 | * | 4/2003 | Dutta ..................... 348/208.11 |
| 2003/0155771 A1 | * | 8/2003 | Cheung et al. .............. 290/1 R |
| 2004/0012683 A1 | * | 1/2004 | Yamasaki et al. ......... 348/208.1 |
| 2004/0218039 A1 | * | 11/2004 | Cooper ......................... 348/66 |
| 2005/0140792 A1 | * | 6/2005 | Hermsen ............... 348/208.12 |

FOREIGN PATENT DOCUMENTS

| JP | 63217778 A | 9/1988 |
| JP | 03068916 A | 10/1991 |
| JP | 2004077852 A | 3/2004 |

* cited by examiner

*Primary Examiner*—Lin Ye
*Assistant Examiner*—Temitope Adeyiga

(57) ABSTRACT

A sensor mounting system for enabling image stabilization in a digital camera is described. An electronic array light sensor is moved in relation to other parts of the camera in response to camera motion. In one embodiment, the sensor is moved by at least one linear motor having a ferrofluid in a gap of the linear motor. Other aspects of the system are described, including methods of heat sinking the sensor, a suspension system, methods of compensating for an effect of temperature on the ferrofluid, and a compact magnet configuration for forming the linear motor and providing feedback as to the position of the sensor.

24 Claims, 11 Drawing Sheets

EXAMPLE RESPONSES TO STEP INPUT

US 7,679,647 B2

FLEXIBLE SUSPENSION FOR IMAGE STABILIZATION

CROSS REFERENCE TO RELATED APPLICATIONS

This application is related to the following applications, all of which are filed on the same date as this application, and all of which are assigned to the assignee of this application:

Ferrofluid suspension for image stabilization (U.S. application Ser. No. 10/896,566), which was published on Jan. 26, 2006 as pending U.S. Patent Application Pub. No. 2006/0018645;

Apparatus and method for heat sinking a sensor (U.S. application Ser. No. 10/896,565), which was published on Jan. 26, 2006 as pending U.S. Patent Application Pub. No. US 2006/0018644;

Method of compensating for an effect of temperature on a control system (U.S. application Ser. No. 10/896,568), which was published on Jan. 26, 2006 as pending U.S. Patent Application Pub. No. 2006/0018646; and Magnet configuration for image stabilization (U.S. application Ser. No. 10/896,526), which was published on Jan. 26, 2006 as pending U.S. Patent Application Pub. No. 2006/0018643.

FIELD OF THE INVENTION

The present invention relates generally to photography, and more specifically to image stabilization.

BACKGROUND OF THE INVENTION

Image blur caused by camera shake is a common problem in photography. The problem is especially acute when a lens of relatively long focal length is used, because the effects of camera motion are magnified in proportion to the lens focal length. Many cameras, including models designed for casual "point and shoot" photographers, are available with zoom lenses that provide quite long focal lengths. Especially at the longer focal length settings, camera shake may become a limiting factor in a photographer's ability to take an unblurred photograph, unless corrective measures are taken.

Some simple approaches to reducing blur resulting from camera shake include placing the camera on a tripod, and using a faster shutter speed. However, a tripod may not be readily available or convenient in a particular photographic situation. Using a faster shutter speed is not always feasible, especially in situations with dim lighting. Shutter speed may be increased if a larger lens aperture is used, but larger-aperture lenses are bulky and expensive and not always available. In addition, the photographer may wish to use a smaller lens aperture to achieve other photographic effects such as large depth of field.

Various devices and techniques have been proposed to help address the problem of image blur due to camera shake. For example, Murakoshi (U.S. Pat. No. 4,448,510) uses an accelerometer to detect camera shake, and provides an indication to the user of the camera if the acceleration exceeds a threshold level. The photographer can then make appropriate adjustments.

Satoh (U.S. Pat. No. 6,101,332) also senses camera shake, and combines the shake information with other camera parameters to estimate how much image blur might result. A set of light emitting diodes communicates the estimate to the photographer, who can then make adjustments.

Another approach has been to automate the camera operation, and let the camera choose settings that will minimize blur. For example, Bolle et al. (U.S. Pat. No. 6,301,440) applies a variety of image analysis techniques in an attempt to improve several aspects of photographs.

Some cameras or lenses are equipped with image stabilization mechanisms that sense the motion of the camera and move optical elements in such a way as to compensate for the camera shake. See for example Otani et al. (U.S. Pat. No. 5,774,266) and Hamada et al. (U.S. Pat. No. 5,943,512).

In a digital camera, the photosensitive element is an electronic array light sensor onto which a scene image is projected by the camera's lens. Some recent digital cameras compensate for camera shake by moving the sensor during the exposure in response to camera motions so that the sensor approximately follows the scene image projected onto it, thus reducing blur.

SUMMARY OF THE INVENTION

A sensor mounting system for enabling image stabilization comprises a generally planar circuit carrier portion, and flexible service loops that connect circuitry on the circuit carrier portion to other circuitry.

DETAILED DESCRIPTION

Figure 1:
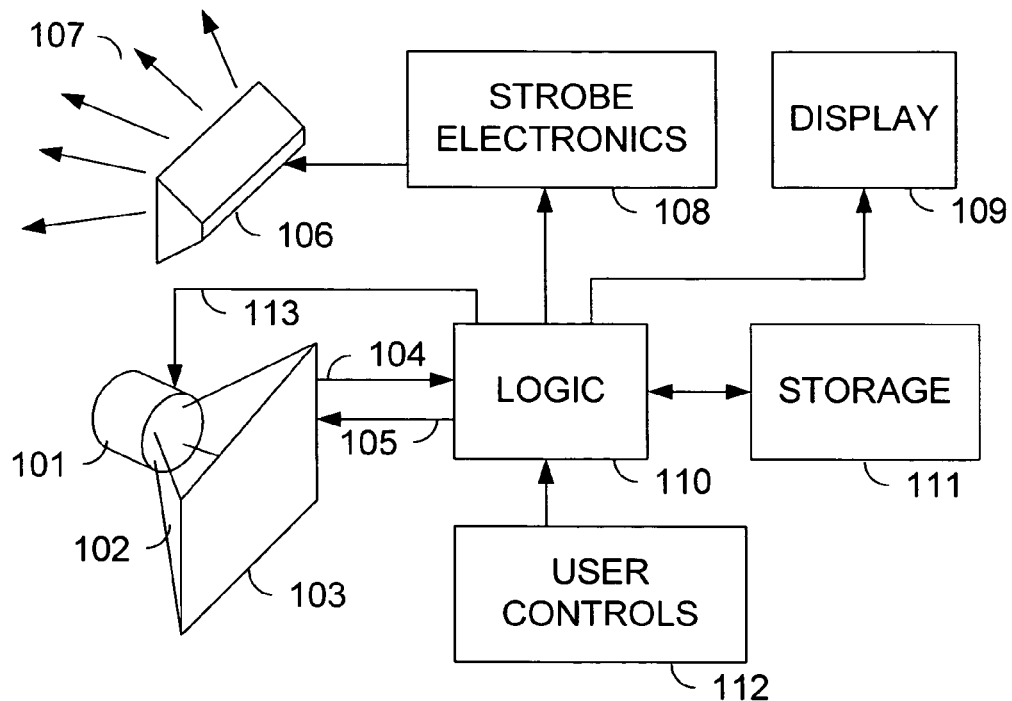
FIG. 1 shows a simplified block diagram of a digital camera.

FIG. 1 shows a simplified block diagram of a digital camera. A lens 101 gathers light emanating from a scene, and redirects the light 102 such that an image of the scene is projected onto an electronic array light sensor 103. Electronic array light sensor 103 may be an array of charge coupled devices, commonly called a "CCD array", a "CCD sensor", or simply a "CCD". Alternatively, electronic array light sensor 103 may be an array of active pixels constructed using complementary metal oxide semiconductor technology. Such a sensor may be called an "active pixel array sensor", a "CMOS sensor", or another similar name. Other sensor technologies are possible. The light-sensitive elements on electronic array light sensor 103 are generally arranged in an ordered rectangular array, so that each element, or "pixel", corresponds to a scene location.

Image data signals 104 are passed to logic 110. Logic 110 interprets the image data signals 104, converting them to a numerical representation, called a "digital image." Logic 110 may perform other functions as well, such as analyzing digital images taken by the camera for proper exposure, adjusting camera settings, performing digital manipulations on digital images, managing the storage, retrieval, and display of digital images, accepting inputs from a user of the camera, and other functions. Logic 110 also controls electronic array light sensor 103 through control signals 105. Logic 110 may comprise a microprocessor, a digital signal processor, dedicated logic, or a combination of these.

Storage 111 comprises memory for storing digital images taken by the camera, as well as camera setting information, program instructions for logic 110, and other items. User controls 112 enable a user of the camera to configure and operate the camera, and may comprise buttons, dials, switches, or other control devices. A display 109 may be provided for displaying digital images taken by the camera, as well as for use in conjunction with user controls 112 in the camera's user interface. A flash or strobe light 106 may provide supplemental light 107 to the scene, under control of strobe electronics 108, which are in turn controlled by logic 110. Logic 110 may also provide control signals 113 to control lens 101. For example, logic 110 may adjust the focus of the lens 101, and, if lens 101 is a zoom lens, may control the zoom position of lens 101.

Figure 2:
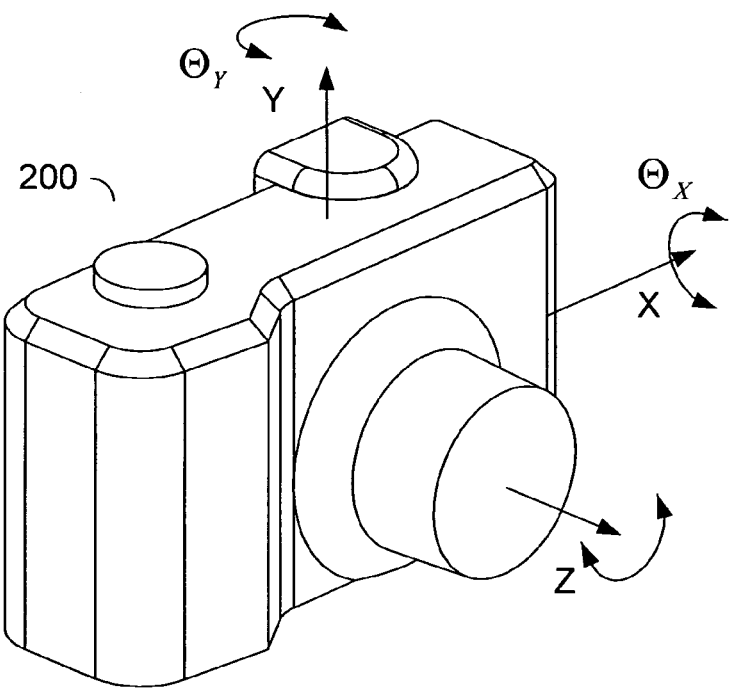
FIG. 2 shows a perspective view of a digital camera, and illustrates a coordinate system convenient for describing motions of the camera.

FIG. 2 shows a perspective view of a digital camera 200, and illustrates a coordinate system convenient for describing motions of the camera 200. Rotations about the X and Y axes, indicated by rotation directions $\theta_X$ and $\theta_Y$ (often called pitch and yaw respectively), are the primary causes of image blur due to camera shake. Rotation about the Z axis and translations in any of the axis directions are typically small, and their effects are attenuated by the operation of the camera lens because photographs are typically taken at large inverse magnifications.

Figure 3:
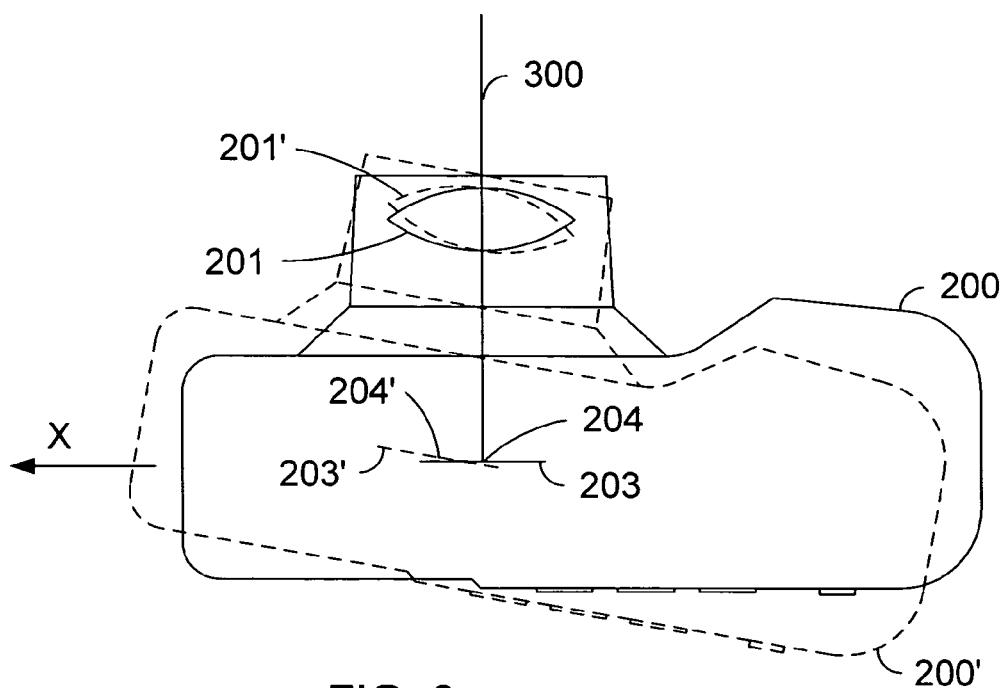
FIG. 3 shows a schematic top view of the camera of FIG. 2, and illustrates how camera rotation can cause image blur.

FIG. 3 shows a schematic top view of camera 200, and illustrates how camera rotation can cause image blur. In FIG. 3, camera 200 is shown in an initial position depicted by solid lines, and in a position, depicted by broken lines, in which camera 200 has been rotated about the Y axis. The reference numbers for the camera and other parts in the rotated position are shown as "primed" values, to indicate that the referenced items are the same items, shifted in position. In FIG. 3, a light ray 300 emanating from a particular scene location, passes through lens 201 and impinges on sensor 203 at a particular location 204. If the camera is rotated, the light ray is not affected in its travel from the scene location to the camera. (Its travel within the camera, after it encounters lens 201' may be slightly affected, depending on the point of rotation of the camera. It is shown as unaffected in FIG. 3, as if the camera has been rotated around the lens nodal point, but even if the camera is rotated about a different point so that there is a deviation of ray 300, the deviation is generally small enough to be neglected by an image stabilization system.) However, sensor 203 moves to a new position, indicated by sensor 203'. The light ray, emanating from the same scene location, now impinges on sensor 203' at a different sensor location than where it impinged on sensor 203, because position 204 has moved to position 204'. If the rotation occurs during the taking of a photograph, then each of the sensor locations where the light ray impinged will have collected light from the same scene location. A photograph taken during the rotation will thus be blurred.

If sensor 203 can be made to move within the camera by an amount just sufficient to keep the sensor position 204 in the path of light ray 300, then the mapping of scene locations to sensor locations can be held fixed, and a sharp photograph can be taken even though the camera may be rotating. The rotation shown in FIG. 3 has been exaggerated for clarity of explanation. In an actual application, the fact that the sensor has rotated slightly can be ignored, and translations of the sensor in the camera's X-direction are sufficient to substantially counter rotations of the camera about the Y axis. Similarly, translations of the sensor in the Y-direction are sufficient to substantially counter rotations of the camera about the X axis.

Figure 4:
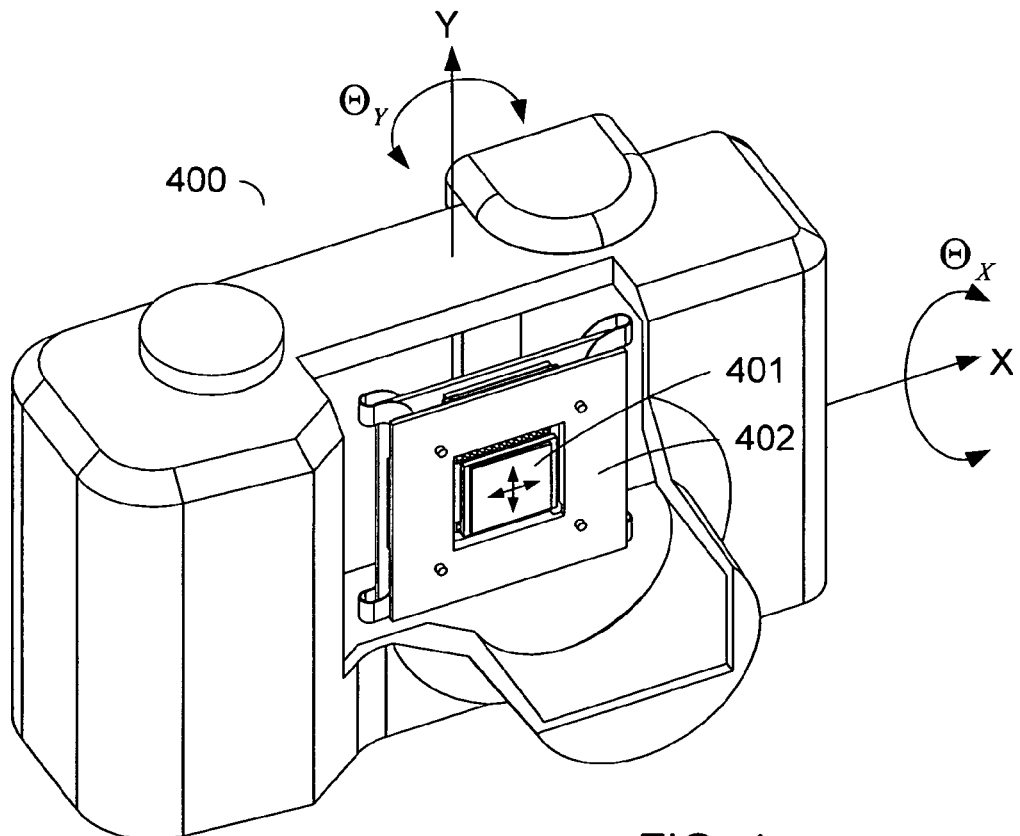
FIG. 4 depicts a cutaway and simplified perspective view of a camera comprising a sensor mounting system in accordance with an example embodiment of the invention.

FIG. 4 depicts a cutaway and simplified perspective view of a camera 400 comprising a sensor mounting system in accordance with an example embodiment of the invention. The lens elements and much of the internal support structure and electronics of example camera 400 are omitted from FIG. 4 for clearer viewing. Camera 400 comprises a suspension assembly 402, which further comprises an electronic array light sensor 401, mounted in suspension assembly 402. Electronic array light sensor 401 is generally rectangular, having a top that faces the camera lens, a bottom opposite the top, and four sides. Suspension assembly 402 enables sensor 401 to move in the camera's X and Y axes. An appropriate control system (not shown) drives sensor 401 in response to rotations of the camera about the Y and X axes in order to compensate for camera shake. Sensor 401 may be, for example, a Sony ICX282AK CCD sensor, or another similar kind of sensor.

Figure 5:
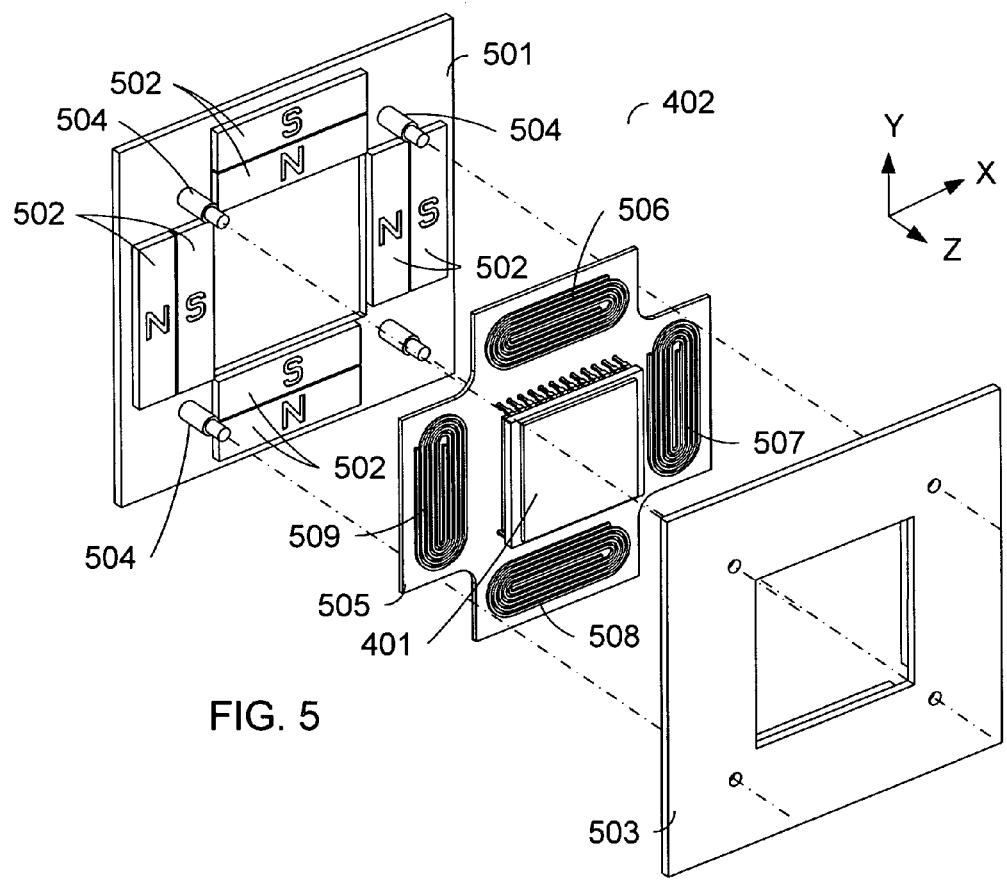
FIG. 5 shows, in perspective, an exploded partial view of a suspension assembly in accordance with an example embodiment of the invention.

FIG. 5 shows, in perspective, an exploded partial view of suspension assembly 402. First plate 501 is substantially rigid, and may be made of steel, aluminum or another suitable material. Affixed to plate 501 are magnets 502. Magnets 502 are arranged in pairs, with each pair comprising magnets placed with their polarities opposite. For example, each pair of magnets 502 has one magnet with its north pole facing away from plate 501 and one magnet with its south pole facing away from plate 501. The pairs of magnets may be fabricated from separate pieces of magnetic material, or may be oppositely-magnetized regions on a single piece of magnetic material.

A second plate 503 also comprises pairs of magnets on the side facing plate 501. (The magnets on plate 503 are not readily visible in FIG. 5.) The magnets on plate 503 are of complementary polarity to the corresponding magnets on plate 501. That is, opposite each of magnets 502 having its south pole facing plate 503 is a magnet on plate 503 with its north pole facing plate 501. In this way, magnets 502 and their corresponding magnets on plate 503 set up magnetic fields between the two plates. A magnet on plate 501 and its complementary magnet on plate 503 make up a set of complementary magnets.

When assembly 402 is assembled, plates 501 and 503 are in fixed relationship to each other, and in fixed relationship to the body of camera 400. They may be held in relative position with spacer studs 504 or by other suitable mechanical means. The attachment of the pair of plates to the body of camera 400 may be by any suitable mechanical means, many of which are known in the art.

Between plates 501 and 503 is a generally planar circuit carrier sensor mounting portion 505. Circuit carrier sensor mounting portion 505 is semirigid or substantially rigid, and may be a common printed circuit board. Alternatively, circuit carrier sensor mounting portion 505 may be a "flex circuit". A flex circuit is similar to a printed circuit board, but has as its substrate a flexible material such as polyimide, polyester, or another suitable material. A flex circuit may be used to electrically interconnect electronic components while enabling their physical relationship to be configured to an available space. Sensor mounting portion 505 may also be a flex circuit with multiple conducting layers, and may have a stiffening member attached.

Mounted on sensor mounting portion 505 are electronic array light sensor 401, and coils 506-509. Sensor mounting portion 505 may also hold circuitry such as bypass capacitors, a buffer amplifier for conditioning the analog image signal produced by electronic array light sensor 401, or other circuitry. Coils 506-509 may be wound from traditional magnet wire and affixed to sensor mounting portion 505, or may be formed by circuit traces integrated into sensor mounting portion 505, or may be formed by other means. If circuit carrier sensor mounting portion 505 has multiple layers, each coil may be made up of circuit traces on more than one of the layers. Each coil is positioned so that when assembly 402 is assembled, each coil is substantially centered between complementary pairs of permanent magnets on plates 501 and 503. When an electric current is passed through any of coils 506-509, a force is generated, acting on the coil. The magnitude of the force is generally proportional to the strength of the magnetic field in which the coil is positioned, the magnitude of the current, and the number of conductors in the coil. The direction of the force is perpendicular to both the direction of current flow and the magnetic field. Thus, current flowing in coils 506 and 508 produces force acting on the coils, and therefore also on current carrier sensor mounting portion 505 and sensor 401, parallel to the Y axis. The force may be in the positive Y direction or the negative Y direction, depending on the direction of current flow in the coil. Similarly, current flowing in coils 507 and 509 produces force parallel to the X axis. The pairs of coils may be wired in series or parallel, or controlled individually.

Thus, each coil 506-509 and its associated set of complementary magnets forms a moving coil linear motor, wherein the magnets are the stator of the linear motor, and the coil is part of the moving member of the linear motor. The linear motors comprising coils 506 and 508 work in concert to move sensor mounting portion 505 in directions parallel to the Y axis, and the motors comprising coils 507 and 509 work in concert to move circuit carrier sensor mounting portion 505 in directions parallel to the X axis. When all four linear motors are operated in concert, generalized X-Y motion of sensor mounting portion 505 can be accomplished. Because the moving coil linear motors are positioned symmetrically about the center of circuit carrier sensor mounting portion 505, the forces generated do not produce any significant torque on sensor mounting portion 505 that would tend to rotate sensor 401 about an axis parallel to the Z axis. That is, the line of action of each motor, or pair of motors working in the same axis, passes as nearly as practicable through the center of mass of the moving assembly.

In an alternative arrangement, coils may be placed on plates 501 and 503, and permanent magnets placed on sensor mounting portion 505, so that each set of coils and magnets forms a moving magnet linear motor. For the purposes of this disclosure, the term linear motor encompasses the motors as depicted in FIG. 5 and moving magnet linear motors, as well as a linear voice coil actuator.

Figure 6:
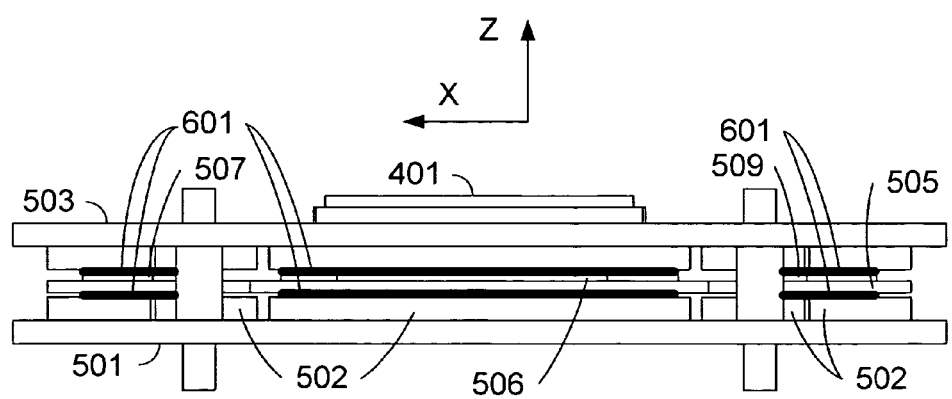
FIG. 6 shows a side view of the suspension assembly of FIG. 5 in its assembled state.

FIG. 6 depicts a side view of assembly 402 in its assembled state. Plates 501 and 503 are spaced sufficiently apart that circuit carrier sensor mounting portion 505 and coils 506-509 can move freely between the magnets attached to plates 501 and 503. Sufficient travel is provided to enable circuit carrier to move sufficiently in the X and Y directions that most common camera shake signals can be compensated. A preferred amount of sensor travel is +/− 1 to 2 millimeters in each axis. Gaps are provided on each side of the moving parts, between circuit carrier sensor mounting portion 505 and magnets 502, and between coils 506-509 and the magnets on plate 503. Preferably, the gaps are 0.1 to 0.5 millimeters thick.

These gaps are substantially filled with a ferrofluid 601. A ferrofluid is a suspension of magnetic particles in a fluid, and reacts to magnetic fields acting on it. Ferrofluids are available from FerroTec, USA corporation, of Nashua, N.H. Ferrofluid 601 is strongly attracted to the region of greatest magnetic flux between the magnets. This attraction, together with capillary action, causes ferrofluid 601 to remain in the gaps, and to hold circuit carrier sensor mounting portion 505 and coils 506-509 relatively stiffly at an equilibrium position between the magnets. That is, coils 506-509 and sensor mounting portion 505 are held away from the magnets, and little movement will occur of circuit carrier sensor mounting portion 505 and coils 506-509 in a direction parallel to the Z axis. However, motion in the X and Y axes (that is, in directions parallel to the X and Y axes) is essentially free of static friction, and is only moderately impeded by dynamic friction, due to the moderate viscosity of ferrofluid 601. Ferrofluid 601 thus forms a fluid bearing, enabling free movement of sensor 401 in the directions desirable for compensating for camera shake, and constraining the movement of sensor 401 in other directions.

While the example embodiment shown in FIGS. 5 and 6 uses four linear motors positioned one on each side of electronic array light sensor 401, other embodiments may comprise fewer than four motors. For example, generalized X-Y motion may be accomplished using only two linear motors, positioned proximate two adjacent sides of an electronic array light sensor. In an application in which vibration is expected in only one axis, a single linear motor may be used to provide motion compensation in that axis.

Figure 7:
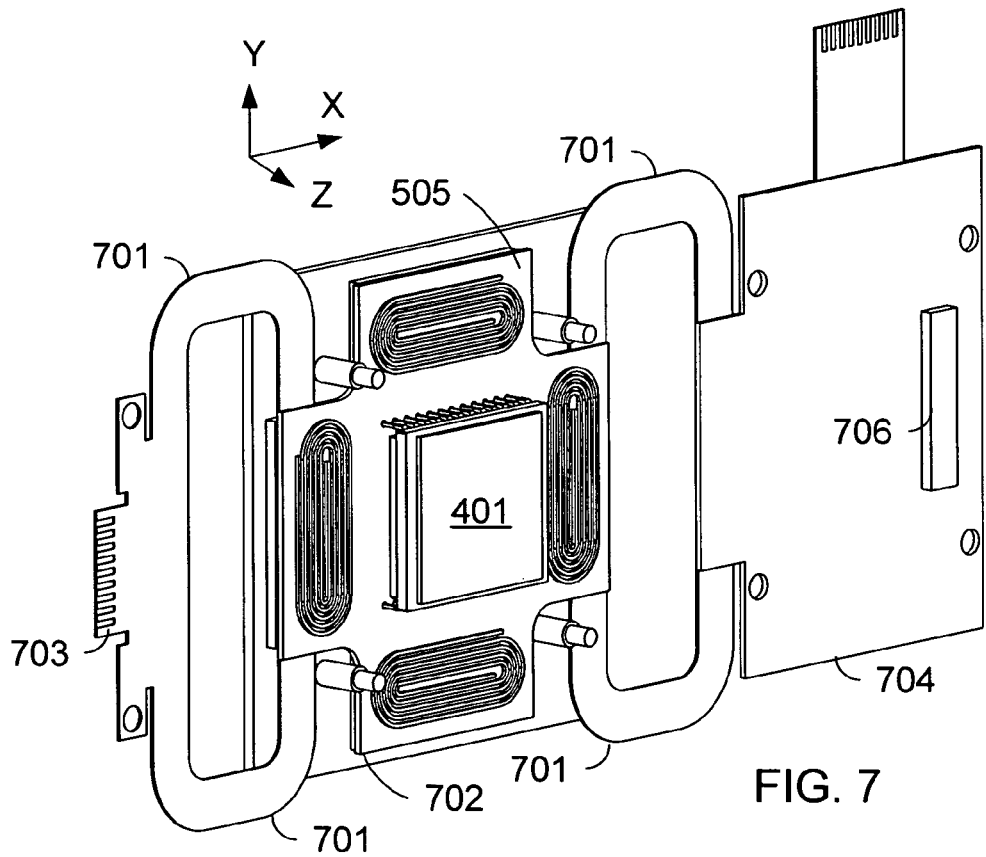
FIG. 7 depicts a circuit carrier in accordance with an example embodiment of the invention, shown in an unfolded configuration.

FIG. 7 depicts a more complete representation of circuit carrier 702, shown in an unfolded configuration. Service loops 701 connect main sensor mounting portion 505 of circuit carrier 702 with connecting portion 703 and other logic mounting portion 704. Preferably, service loops 701 are flex circuit regions each with a single circuit layer, for maximum flexibility. Other logic mounting portion 704 may preferably comprise multiple circuit layers, and may hold circuitry that interacts with sensor 401 and coils 506-509. Such circuitry may comprise a timing generator for sensor 401, power amplifiers for controlling the current flowing in coils 506-509, buffer memory, motion sensors, or other devices. Connector 705 further connects the circuitry on circuit carrier 702 with other camera subsystems, such as a microprocessor system, non-volatile storage, or other components. Connector 706 is configured to receive connecting pads on connecting portion 703. Alternatively, the connecting pads may be soldered to other logic mounting portion 704, or another kind of connection may be provided.

Many other variations of which circuitry components to put on which circuit carrier portion are possible. For example, service loops 701 may connect sensor mounting portion 505 to more than one other logic mounting portion, as when connecting portion 703 has logic mounted on it. The other logic mounting portions may be connected together, or independently connected to another circuit board.

Preferably, critical control and data signals relating to sensor 401 will be routed through the loops 701 most directly connected to other logic mounting portion 704, where the signals may be digitized, strengthened, or otherwise processed. This routing minimizes the trace length between sensor 401 and the interface circuitry, thus minimizing the opportunity for noise contamination of critical signals. Other, less critical signals may be routed through the other loops, through connecting portion 703 to other logic mounting portion 704.

Figure 8:
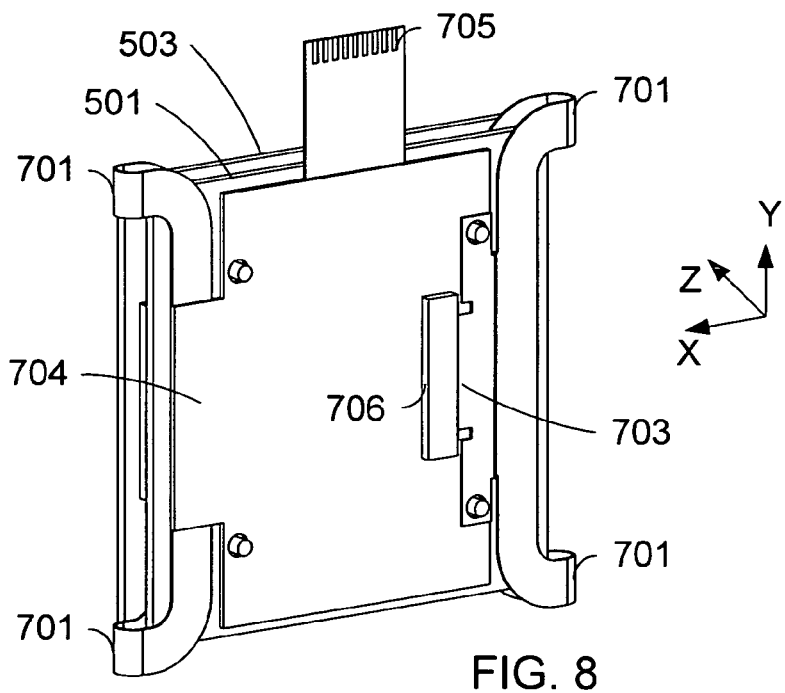
FIG. 8 shows the circuit carrier of FIG. 7 in a folded configuration.
Figure 9A:
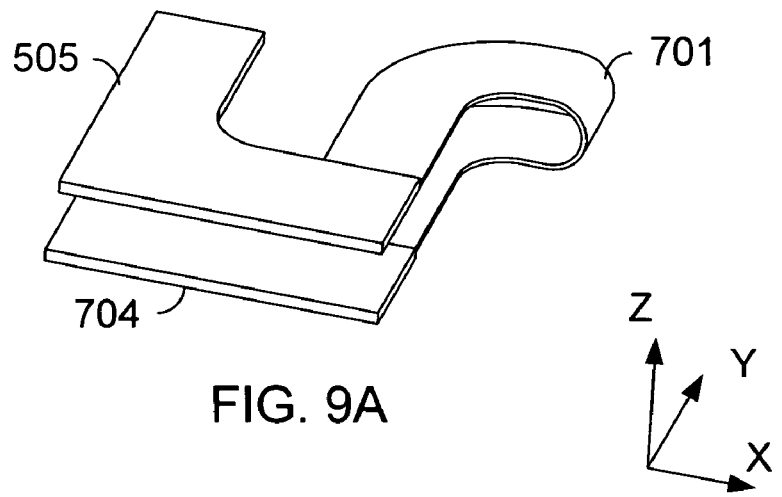
FIGS. 9A, 9B, and 9C depict the flexing of a service loop of the circuit carrier of FIG. 7, as a portion of the circuit carrier is displaced from its nominal position.
Figure 9B:
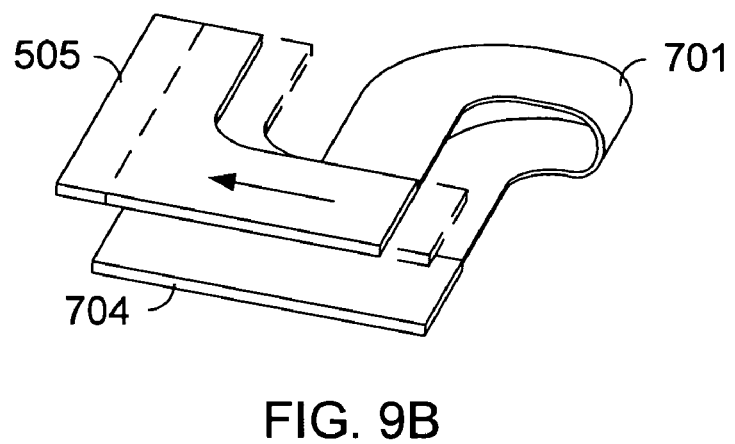
Figure 9C:
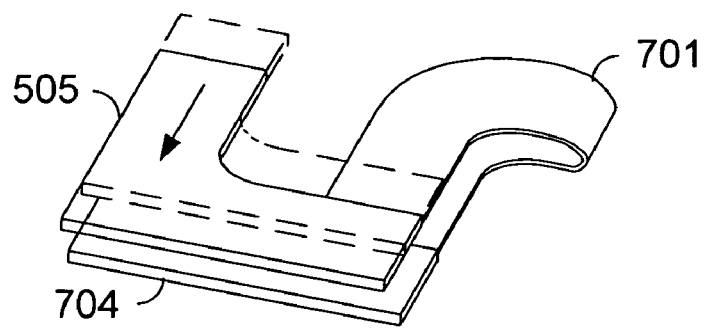

Service loops 701 are placed, as nearly as is practicable, symmetrically about the center of mass of the moving assembly of the system. Full rotational symmetry is not required; service loops 701 may be substantially mirror-symmetric about orthogonal axes passing through the center of mass of the moving assembly. (Mirror symmetry is shown in FIG. 7.) Once circuit carrier 702 is folded into the configuration of FIG. 8, any forces exerted on sensor mounting portion 505 by service loops 701 are symmetrical, and therefore do not induce significant rotation of sensor mounting portion 505 about the Z axis. Other logic mounting portion 704 remains stationary during operation, while service loops 701 enable translation of sensor mounting portion 505, and therefore also translation of sensor 401, in the X and Y axes. FIG. 9A depicts a detail view of one of service loops 701 in its nominal position. FIG. 9B shows the same loop flexing as sensor-mounting portion 505 moves in the in the negative X direction, and FIG. 9C shows the same loop flexing as sensor-mounting portion 505 moves in the negative Y direction.

Other service loop configurations may be envisioned as well. For example, a system using only two service loops may be used. The two service loops may emanate from opposite edges of sensor mounting portion 505.

Figure 10:
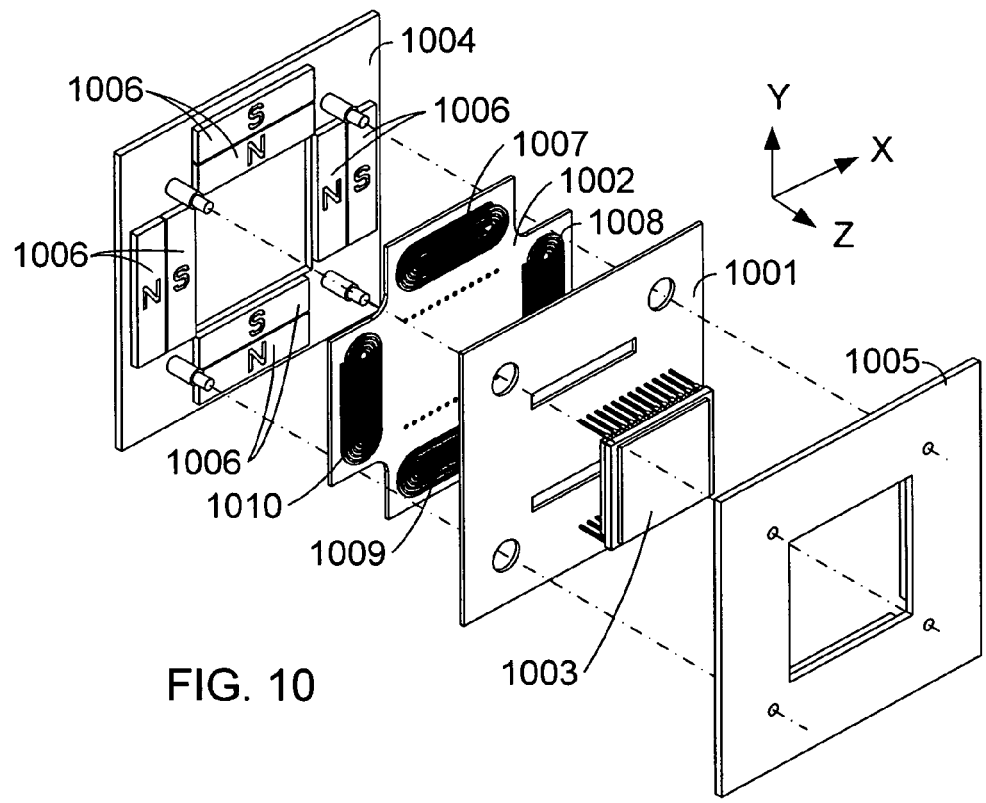
FIG. 10 shows, in perspective, an exploded partial view of a sensor mounting system in accordance with a second example embodiment of the invention.

FIG. 10 shows, in perspective, an exploded partial view of a sensor mounting system in accordance with a second example embodiment of the invention. In this example embodiment, a generally planar heat sink 1001 is interposed between circuit carrier sensor mounting portion 1002 and sensor 1003. Heat sink 1001, circuit carrier sensor mounting portion 1002, and sensor 1003 are attached together, so that they move as a unit during image stabilization. In particular, heat sink 1001 is preferably in close contact with the bottom surface of sensor 1003, so that heat transfer is facilitated from sensor 1003 into heat sink 1001.

Figure 11:
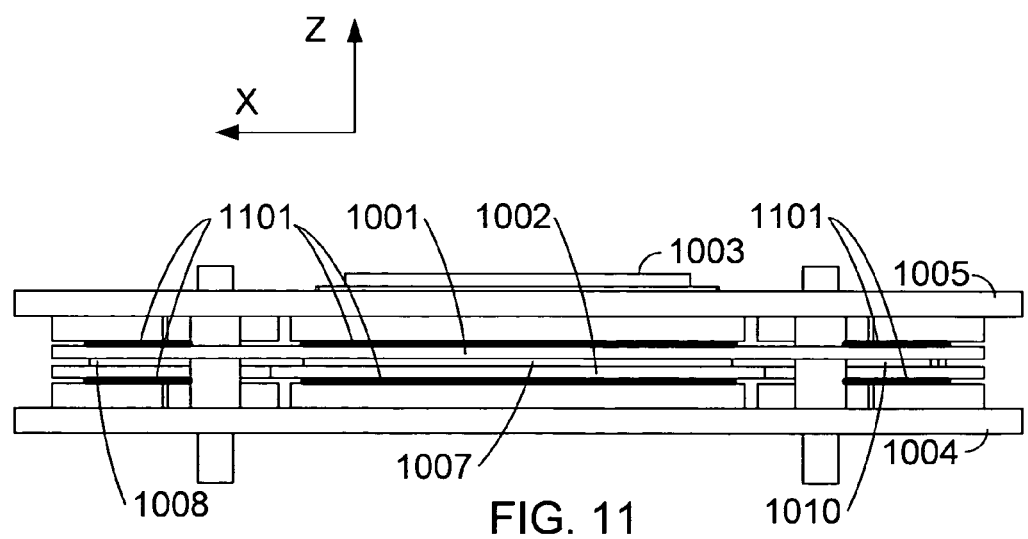
FIG. 11 shows a side view of the mechanism for image stabilization of FIG. 10.

FIG. 11 shows a side view of the mechanism for image stabilization of FIG. 10. Plates 1004 and 1005 are spaced apart such that the unit comprising heat sink 1001, circuit carrier sensor mounting portion 1002, and sensor 1003 can move freely between the magnets 1006 mounted on plate 1004 and complementary magnets on plate 1005. Preferably, a gap of 0.1 to 0.5 millimeters may be provided between heat sink 1001 and magnets 1006, and a similar gap may be provided between circuit carrier sensor mounting portion 1002 and the magnets mounted on plate 1004. Coils 1007-1010 may be wire coils affixed to circuit carrier sensor mounting portion 1002 or may be circuit traces that are part of sensor mounting portion 1002. Circuit carrier sensor mounting portion 1002 may comprise multiple circuit layers.

A quantity of ferrofluid is inserted into each gap. The quantity is sufficient to substantially fill the gap between a pair of magnets and the nearby surface of heat sink 1001 or circuit carrier sensor mounting portion 1002. The ferrofluid is naturally drawn to the region of highest magnetic flux between the magnets, and, in moving to that region, pushes the unit comprising heat sink 1001 and circuit carrier sensor mounting portion 1002 to an equilibrium Z position between the magnets. Thus, a fluid bearing is formed that holds heat sink 1001 and sensor mounting portion 1002 relatively stiffly in the Z axis, while enabling motion in the X and Y axes substantially unimpeded by static friction.

The ferrofluid also provides an enhanced heat conduction path for removing heat from sensor 1003. The performance of sensor 1003 may be dependent on its operating temperature. For example, if sensor 1003 is a CCD sensor, it generates heat during much of the time the camera is operating, and its dark noise level is strongly correlated to its operating temperature. It is desirable to draw excess heat away from sensor 1003 and dissipate it. Heat sink 1001 is preferably made of a lightweight, rigid or semi-rigid material that is a good conductor of heat. The thickness of heat sink 1001 is chosen by balancing its effect on the performance of the control system performing the image stabilization, the mechanical stiffness of heat sink 1001, and the thermal effectiveness of heat sink 1001. Preferably, heat sink 1001 is about 0.5 to 1.0 millimeters thick, and made of aluminum.

Heat is transferred into heat sink 1001 from the bottom of sensor 1003, and is carried by heat sink 1001 toward lower-temperature areas. Ferrofluid 1101 provides a heat conduction path to the magnets mounted on plates 1004 and 1005, which typically operate at a lower temperature than does sensor 1003. Plates 1004 and 1005 may provide further thermal mass, in addition to the thermal mass supplied by components already encountered, into which heat may flow, to be ultimately dissipated through the body of the camera comprising the stabilization mechanism and into the surrounding environment. The term thermal mass refers to material capable of absorbing a relatively large amount of thermal energy without changing its temperature substantially.

In an alternative example embodiment, the heat sinking function is provided by a layer of conductive material comprised in circuit carrier sensor mounting portion 1002. For example, if sensor mounting portion 1002 is a flex circuit comprising multiple circuit layers, one of the layers may be devoted to providing a substantially contiguous copper sheet that facilitates the conduction of heat away from sensor 1003. Alternatively, a thermally conductive cladding layer may be provided on sensor mounting portion 1002. In yet another embodiment, interstitial areas between circuit traces in any and all layers of sensor mounting portion 1002 may be substantially filled with circuit trace material, generally copper, in order to enhance the thermal conductivity of sensor mounting portion 1002. The infilling material may be electrically isolated from active circuit traces, or may be formed by enlarging the active circuit traces.

Figure 12:
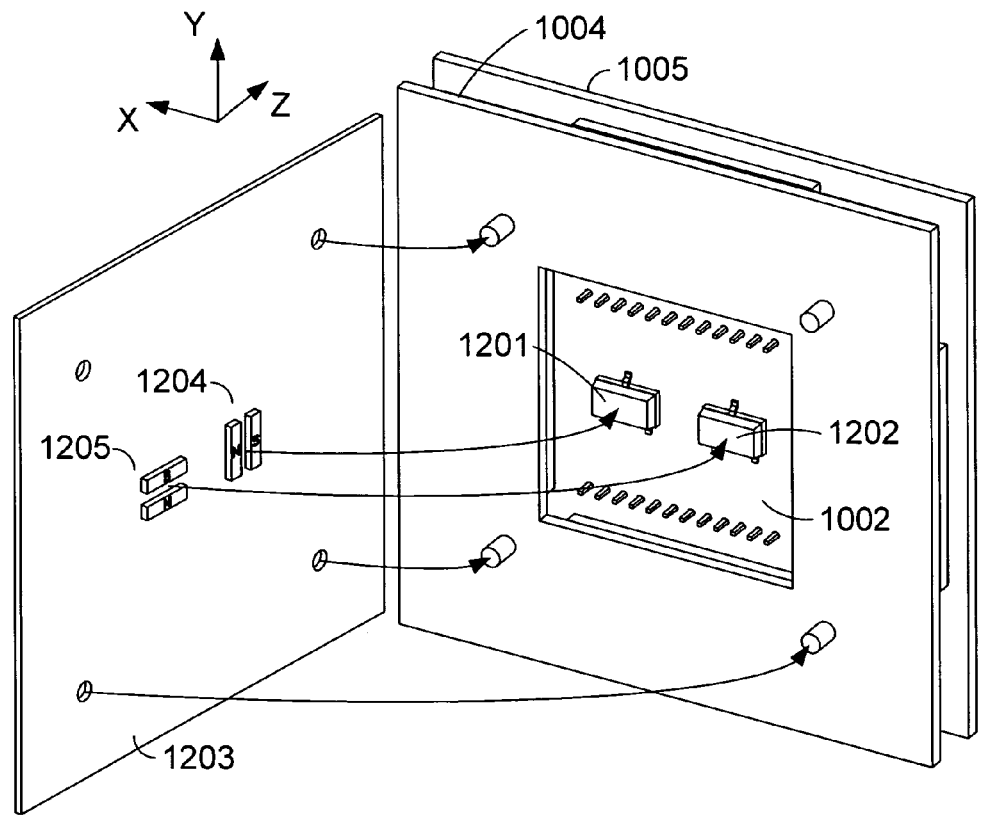
FIG. 12 depicts the example sensor mounting system of FIG. 10, with additional components shown.

FIG. 12 depicts the example sensor mounting system of FIG. 10, with additional components shown. Hall effect sensors 1201 and 1202 are mounted on the back side of circuit carrier sensor mounting portion 1002, opposite electronic array light sensor 1003. Preferably, Hall effect sensors 1201 and 1202 are "analog", or "linear" type sensors. An analog or linear Hall effect sensor, when connected to appropriate driving circuitry, produces a voltage proportional to the strength of a magnetic field acting on it. Hall effect sensors are widely available.

A sense magnet plate 1203 holds sense magnet pairs 1204 and 1205. Magnet plate 1203 is preferably made of steel, or another suitable magnetic material. Magnet pairs 1204 and 1205 are affixed on plate 1203 and positioned such that when plate 1203 is in its assembled position and circuit carrier sensor mounting portion 1002 is in the nominal center of its available travel, the sensing element of Hall effect sensor 1201 is positioned over the center of magnet pair 1204, and the sensing element of Hall effect sensor 1202 is positioned over the center of magnet pair 1205. The sensing element of each Hall effect sensor is much smaller than the device package. Each magnet pair comprises a permanent magnet with its north pole facing away from magnet plate 1203, and a magnet with its south pole facing away from magnet plate 1203.

When circuit carrier sensor mounting portion 1002 is in the center of its available travel range, the effects of the north and south magnets of each pair on its corresponding Hall effect sensor tend to cancel, and the voltage produced by the Hall effect sensor is a reference value. Using magnet pair 1204 and Hall effect sensor 1201 as an example, as circuit carrier sensor mounting portion 1002 (and thus Hall effect sensor 1201, which is mounted on sensor mounting portion 1002) move in the X direction, the sensing element of Hall effect sensor 1201 is increasingly affected by the magnetic field from the "south" magnet of magnet pair 1204, while the effect of the "north" magnet diminishes. The voltage produced by Hall effect sensor 1201 changes from its reference value approximately in proportion to the distance moved by circuit carrier sensor mounting portion 1002. When circuit carrier sensor mounting portion 1002 moves in the negative X direction, the "north" magnet increasingly dominates, and the voltage produced by Hall effect sensor 1201 changes in the opposite sense, in rough proportion to the position of circuit carrier sensor mounting portion 1002. For example, motion in the X direction may produce an increasing voltage, while motion in the negative X direction may produce a decreasing voltage.

Similarly, Hall effect sensor 1202 and magnet pair 1205 provide a voltage that is related to the position of circuit carrier sensor mounting portion 1002 in the Y axis. Hall effect sensors 1201 and 1202 thus provide feedback signals indicating the position of sensor mounting portion 1002. These position feedback signals may be used by an appropriate control system that measures rotations of the camera, and drives circuit carrier sensor mounting portion 1002 (and thus sensor 1003) in such a way as to counter the camera rotation, providing an image stabilization function.

As has been previously described, circuit carrier sensor mounting portion 1002 is suspended between plates 1004 and 1005 by a ferrofluid bearing. The performance of the control system performing image stabilization depends on several factors, including the mass of the assembly moved by the control system, the characteristics of the linear motors, and the viscosity of ferrofluid 1101, as well as other factors. The viscosity of ferrofluid 1101, in turn, is dependent on its temperature. Ferrofluid 1101 is more viscous at relatively colder temperatures and less viscous at relatively higher temperatures. Thus, it resists motion of circuit carrier sensor mounting portion 1002 more strongly at colder temperatures, and provides more damping to the control system.

It is desirable for the camera comprising the stabilization system to operate over a wide temperature range, and for its performance to be generally consistent at all temperatures in the range. A camera in accordance with an example embodiment of the invention may compensate for the effects of varying temperature in one of several ways. For example, the camera may characterize the dynamic performance of the control system and, when the performance departs significantly from a nominal performance, adjust at least one control system parameter in response to the characterization in order to maintain consistency of operation. Alternatively, the camera may measure its internal temperature and modify at least one control system parameter based on a previous characterization of the effect of temperature on the camera's designed performance. For example, a temperature sensing element such as a thermistor may be designed into the camera's circuitry, or the camera may use a control processor that has a built-in temperature measuring capability. And finally, a camera may compensate for the effect of temperature by warming the ferrofluid, thereby bringing its viscosity, and therefore also the camera's dynamic performance, closer to its nominal condition.

Figure 13:
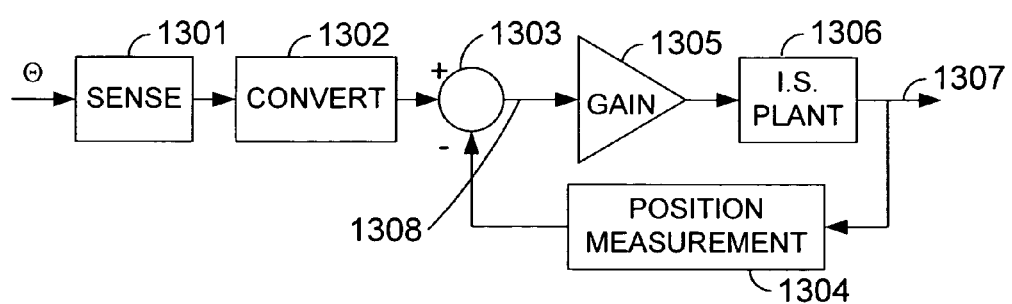
FIG. 13 shows a simplified block diagram of a control system for performing image stabilization in one axis of motion.

FIG. 13 shows a simplified block diagram of a control system for performing image stabilization in one axis of motion. For example, the control system of FIG. 13 may move circuit carrier sensor mounting portion 1002 in the X axis to compensate for camera rotation about the Y axis. A corresponding control system (not shown) compensates for camera rotation about the X axis by moving circuit carrier sensor mounting portion 1002 in the Y axis. In block 1301, camera rotation is sensed. The sensing may be accomplished using an accelerometer, a rate gyroscope, or another suitable device. In conversion block 1302, the output of the sensing device is converted to the proper units and magnitude for the subsequent control loop. For example, if rotation is sensed using a rate gyroscope, then the sensing device produces a signal indicating the rate of camera rotation. The conversion at block 1302 would then comprise integrating the signal to obtain a signal indicating the rotational position of the camera. The conversion at block 1302 may further comprise scaling the position signal based on the focal length of the camera lens, and scaling the signal to match the transfer gain characteristics and dynamic range of the subsequent control loop. The output of conversion block 1302 is a position command, indicating the position of circuit carrier sensor mounting portion 1002 required to compensate for the measured camera rotation.

At differencer 1303, the commanded position is compared with the actual position of circuit carrier sensor mounting portion 1002, as indicated by position measurement block 1304. Position measurement block 1304 may comprise, for example Hall effect sensor 1201 and magnet pair 1204. Differencer 1303 produces a difference signal 1308, indicating the magnitude and direction of the present error in the position of sensor mounting portion 1002. This difference signal is amplified at amplifier 1305, and is fed to the image stabilization plant 1306. Image stabilization plant 1306 represents the dynamics of the image stabilization mechanism, comprising the linear motors driving circuit carrier sensor mounting portion 1002, the mass of sensor mounting portion 1002 and its associated circuitry, the viscous friction induced by ferrofluid 1101, and other items. The output of the image stabilization plant is the sensor position 1307.

Differencer 1303 is preferably performed digitally. That is, preferably, conversion block 1302 and position measurement block 1304 comprise analog-to-digital (A/D) converters so that the commanded position output from conversion block 1302 and the measured position output from position measurement block 1304 are numerical values. The function of differencer 1303 is then preferably performed in a microprocessor, digital signal processor, or similar digital logic. Amplifier 1305 may be implemented digitally as well, and the resulting signal converted, using a digital-to-analog (D/A) converter, to a signal for driving image stabilization plant 1306.

In a first technique useful in compensating for the effects of temperature changes on the viscosity of ferrofluid 1101 and the resulting changes in the performance of the control system, the logic that implements the control system characterizes the system by subjecting the position control loop to a standardized signal, and monitoring the resulting sensor position.

Figure 14:
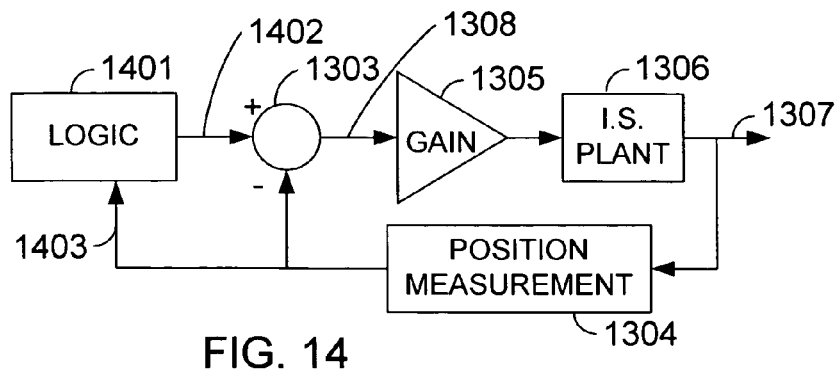
FIG. 14 depicts the control system of FIG. 13 configured for self-characterization.

FIG. 14 depicts the control system of FIG. 13 configured for self-characterization. In FIG. 14, logic 1401 produces a calibration command signal 1402. Calibration command signal may be a step command, or a cyclic signal such as a sine wave or square wave. Preferably, the signal is in digital form. Logic 1401 also receives actual position signal 1403, which is the output of position measurement block 1304. Preferably, position signal 1403 is also in digital form. By monitoring position signal 1403, logic 1401 can measure the response of the position control loop to calibration command signal 1402.

Figure 15:
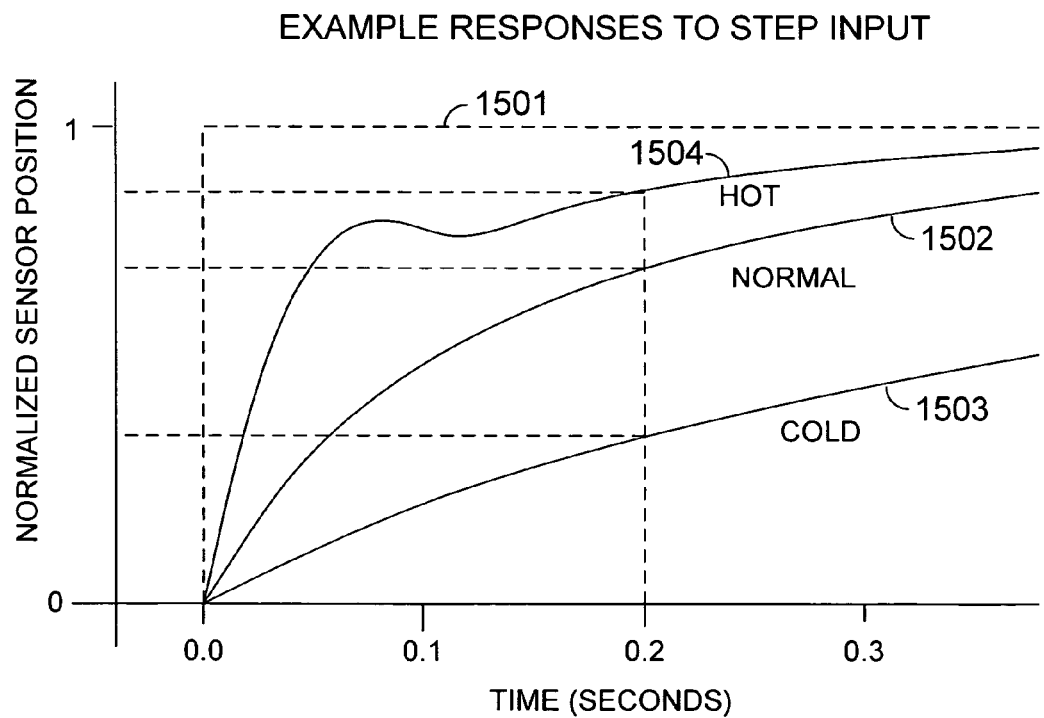
FIG. 15 depicts example responses of the control system of FIG. 13 to a step input, at several different example temperatures.

For example, FIG. 15 depicts example responses of the system to a step input, at several different example temperatures. Trace 1501 represents the step input, normalized so that the step commands a movement of one displacement unit. Curves 1502, 1503, and 1504 represent example responses of the system at normal, cold, and hot temperatures respectively. Because the ferrofluid is more viscous at cold temperatures, the system responds more slowly at the cold temperature. By measuring the fraction of the step input command the system has moved at a fixed time, such as 0.2 seconds after the command in the example of FIG. 15, the responsiveness of the system can be determined. Alternatively, logic 1401 may sample the step response at several times so that the response of the system can be more completely characterized.

Figure 16:
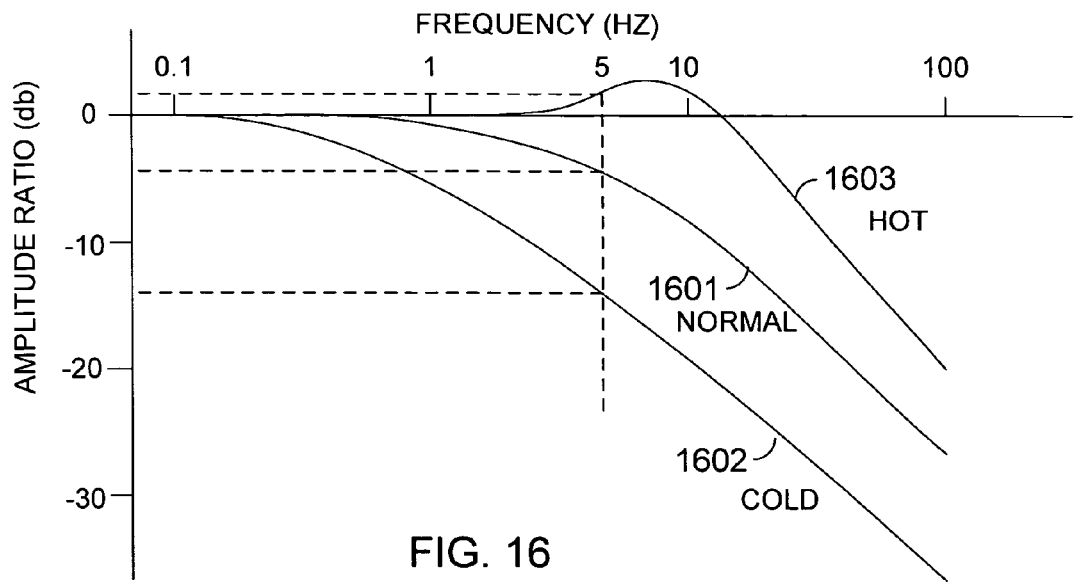
FIG. 16 illustrates example frequency responses of the control system of FIG. 13 at different temperatures, presented in a Bode plot.

As an alternative to a step input position command, logic 1401 may subject the system to a periodic calibration command signal 1402, and characterize the performance of the system by measuring its frequency response. For example, a sinusoidal calibration command signal 1402 will result in a generally sinusoidal position signal 1403, but position signal 1403 will be shifted in phase in relation to calibration command signal 1402, and will have an amplitude that is a function of the dynamics of the control system and the frequency of the sinusoidal calibration command signal 1402. FIG. 16 illustrates example frequency responses of the system at different temperatures, presented in a Bode plot. Curves 1601, 1602, and 1603 represent the frequency responses of the system at normal, cold, and hot temperatures respectively. The increased viscosity of the ferrofluid at cold temperatures tends to attenuate the amplitude of position signal 1403. By subjecting the system to a sinusoidal input at a known frequency, for example five Hertz, and noting the corresponding amplitude of position signal 1403, the responsiveness of the system can be characterized. Alternatively, logic 1401 may sample the amplitude of position signal 1403 at several frequencies in order to more completely characterize the system, and may use a periodic calibration command signal that is other than sinusoidal. For example, calibration command signal 1402 may be a square wave.

In a second technique useful in compensating for the effects of temperature changes on the viscosity of ferrofluid 1101, the control system may be adjusted based on the results of a system characterization in order to make the system performance relatively more consistent over a range of temperatures. For example, when the characterization indicates that a cold temperature has caused the system to be sluggish, the logic implementing the control system may increase the gain of amplifier 1305. At elevated temperatures, the viscosity of ferrofluid 1101 is reduced, and the control system may become so responsive that undesirable oscillations, sometimes called "ringing" are introduced. In that case, the logic implementing the control system may decrease the gain of amplifier 1304.

Figure 17:
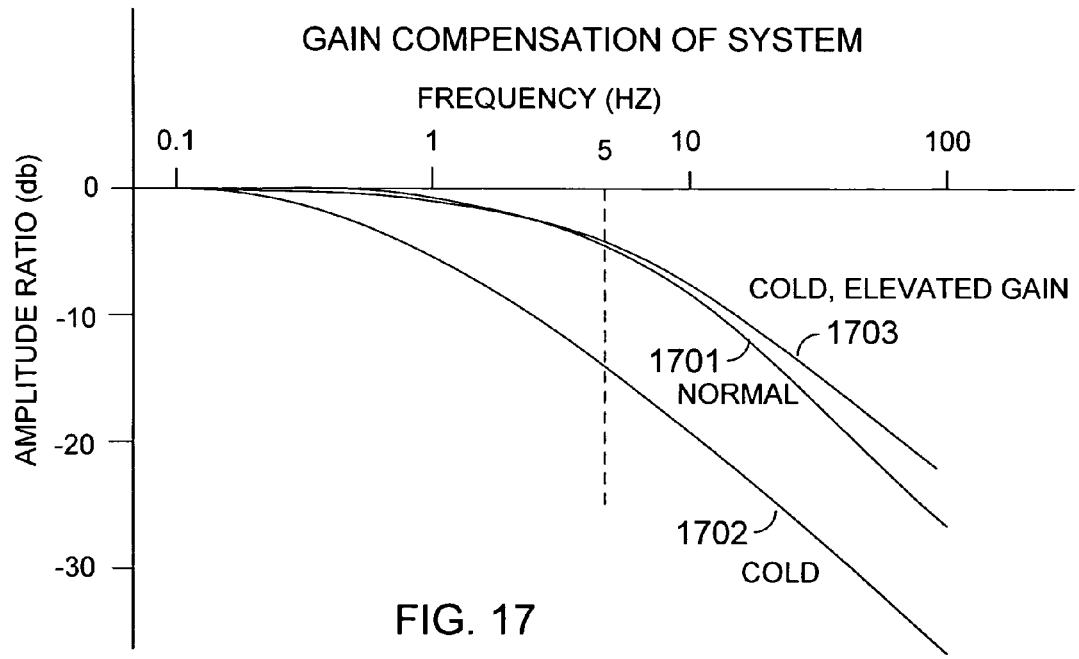
FIG. 17 illustrates the effect of increased gain on the frequency response of the control system of FIG. 13 at a cold temperature.

If amplifier 1305 is implemented digitally, the increase or decrease may be accomplished with a simple numerical multiplication. FIG. 17 illustrates the effect of the increased gain on the system frequency response of a cold system. Curve 1701 is an example frequency response of the system at a normal temperature. Curve 1702 is an example frequency response at a cold temperature. Curve 1703 illustrates that elevating the system gain can adjust the system frequency response of the cold system to approximate the normal temperature behavior. In an example method for compensating for temperature variations, logic 1401 measures the amplitude of position signal 1403 in response to a preselected periodic calibration command signal 1402. If the amplitude of position signal 1403 differs from the amplitude expected at a normal operating temperature, logic 1401 may increase or decrease the gain of amplifier 1305 and remeasure the amplitude of position signal 1403, repeating the procedure as necessary until the amplitude of position signal 1403 approaches that of a system operating at a normal temperature operation or is otherwise satisfactory, or the operating limits of the system have been reached. Alternatively, the system may apply a preselected gain adjustment, determined from prior experiment, that is selected to compensate for a particular frequency response measurement.

In a third technique useful in compensating for the effects of temperature changes on the viscosity of ferrofluid 1101, the control system may adjust the actual temperature of ferrofluid 1101 in order to improve the system performance. For example, in the sensor mounting system of FIGS. 10 and 11, coils 1007-1010 are positioned between layers of ferrofluid 1101, separated from it only by heat sink 1001 or by circuit carrier sensor mounting portion 1002. The control system performing image stabilization is configured to supply electrical current through coils 1007-1010 as part of the process of image stabilization. Coils 1007-1010 are preferably made of copper or a suitable copper alloy, which resists the flow of current. As a result, current flowing through any of the coils causes the coil to dissipate energy in the form of heat. This heat-generating effect may be used to warm ferrofluid 1101 in order to lower its viscosity and improve the performance of the image stabilization system.

For example, when it is detected that the system performance is sluggish, logic 1401 may pass a current through coils 1007-1010 for a period of time estimated, based on the characterization of system performance, to warm the ferrofluid sufficiently to bring the system performance to a level similar to a system operating at a normal temperature. Alternatively, the system may pass a current through coils 1007-

1010 for a preselected time and the recharacterize the system performance, repeating the process until the system performance is satisfactory, or until a budget of energy allocated to ferrofluid heating is depleted.

The current passed through the coils may be direct or alternating current. A direct current will drive circuit carrier sensor mounting portion 1002 against its travel stops. An alternating current of a frequency below or similar to a resonant frequency of the control system will cause oscillating motion of sensor mounting portion 1002. For example, a frequency between one-half of the resonant frequency and double the resonant frequency may be considered similar to the resonant frequency. The oscillating motion may have advantages in that it may induce additional frictional heating of ferrofluid 1101, and may serve to distribute the heat from coils 1007-1010 more evenly through ferrofluid 1101. An alternating current of higher frequency may induce little or no detectable motion of circuit carrier sensor mounting 1002.

Figure 18:
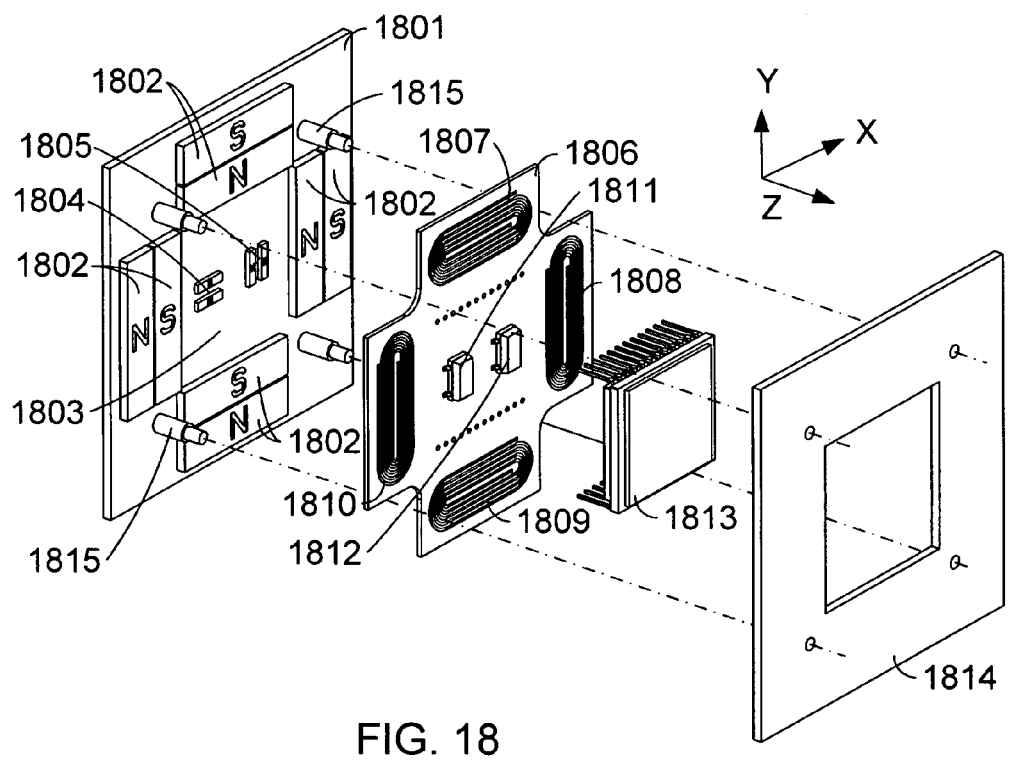
FIG. 18 shows, in perspective, an exploded partial view of a sensor mounting system in accordance with another example embodiment of the invention.

FIG. 18 shows, in perspective, an exploded partial view of a sensor mounting system in accordance with another example embodiment of the invention. The example mounting system of FIG. 18 is especially compact. A magnet plate 1801 holds pairs of drive magnets of 1802, each pair comprising a magnet with its north pole facing away from plate 1801 and a magnet with its south pole facing away from plate 1801. The pairs of drive magnets 1802 surround a generally rectangular area 1803 of plate 1801. Mounted inside area 1803 are sense magnet pairs 1804 and 1805. A circuit carrier sensor mounting portion 1806 comprises coils 1807-1810, which are formed of circuit traces comprised in circuit carrier sensor mounting portion 1806, and thus do not add significant thickness to sensor mounting portion 1806.

Also mounted on circuit carrier sensor mounting portion 1806 are Hall effect sensors 1811 and 1812. Hall effect sensors 1811 and 1812 are positioned such that, when sensor mounting portion 1806 is in its nominal position, the sensing elements of sensors 1811 and 1812 are centered on sense magnet pairs 1804 and 1805, respectively. Electronic array light sensor 1813 mounts on circuit carrier sensor mounting portion 1806, straddling Hall effect sensors 1811 and 1812.

Circuit carrier sensor mounting portion 1806 is suspended between magnet plate 1801 and second plate 1814. The two plates are held apart by spacers 1815 such that a gap can be maintained between circuit carrier 1806 and magnets 1802, and also between circuit carrier 1806 and second plate 1814. Plate 1814 does not have magnets mounted on it, but is made of a magnetically permeable material, such as steel, so that it serves to complete a magnetic circuit between members of magnet pairs 1802. Thus, coils 1807-1810 are positioned in areas of magnetic flux. Magnets 1802, plate 1814, and coils 1807-1810 are thus comprised in linear motors that move circuit carrier sensor mounting portion 1806, and consequently sensor 1813, in the X and Y axes.

Figure 19:
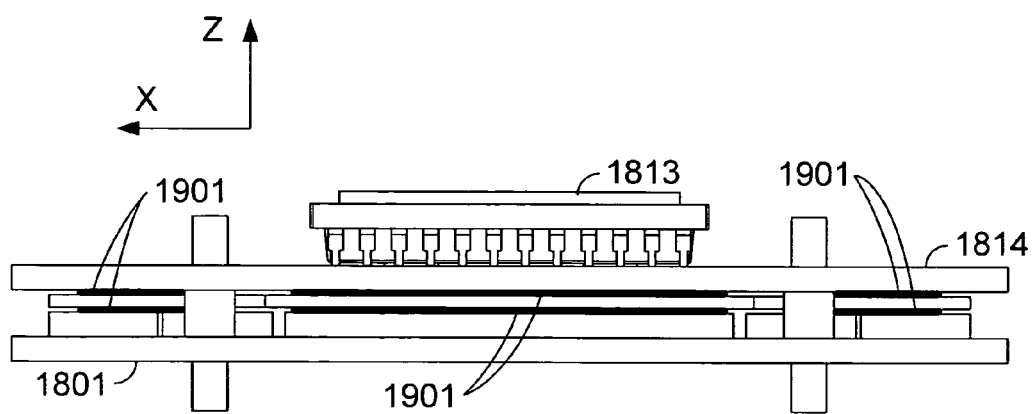
FIG. 19 shows the sensor mounting system of FIG. 18 in its assembled state.

The gaps between circuit carrier sensor mounting portion 1806 and magnets 1802, and between sensor mounting portion 1806 and plate 1814 are substantially filled with a ferrofluid, which is strongly attracted to the areas of magnetic flux, and serves to hold circuit carrier sensor mounting portion 1806 in an equilibrium Z position between magnets 1802 and plate 1814. FIG. 19 shows the sensor mounting system of FIG. 18 in its assembled state. The ferrofluid in the motor gaps is denoted as element 1901 in FIG. 19. Ferrofluid 1901 forms a fluid bearing, constraining circuit carrier sensor mounting portion 1806 in the Z axis, but enabling motion of sensor mounting portion 1806 in the X and Y axes substantially free of static friction.

In an alternative arrangement, the positions of the Hall effect sensors and the sense magnets may be interchanged, so that the sense magnets are comprised in the moving assembly and the Hall effect sensors are stationary with respect to the rest of the camera. In either arrangement, applications may be envisioned that do not require a full complement of two Hall effect sensors and two pairs of sense magnets. At a minimum, at least one Hall effect sensor and at least one sense magnet may suffice in some applications.

Figure 20:
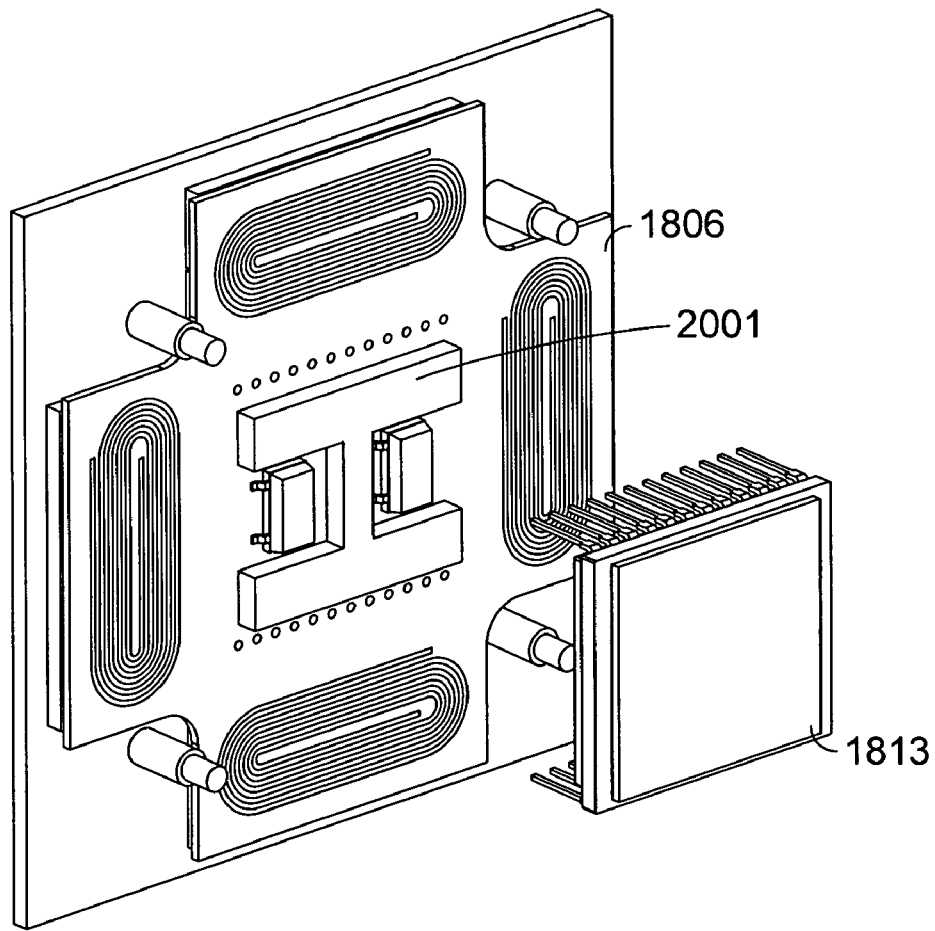
FIGS. 20 and 21 illustrate a technique for heat sinking the sensor in the sensor mounting system of FIGS. 18 and 19.
Figure 21:
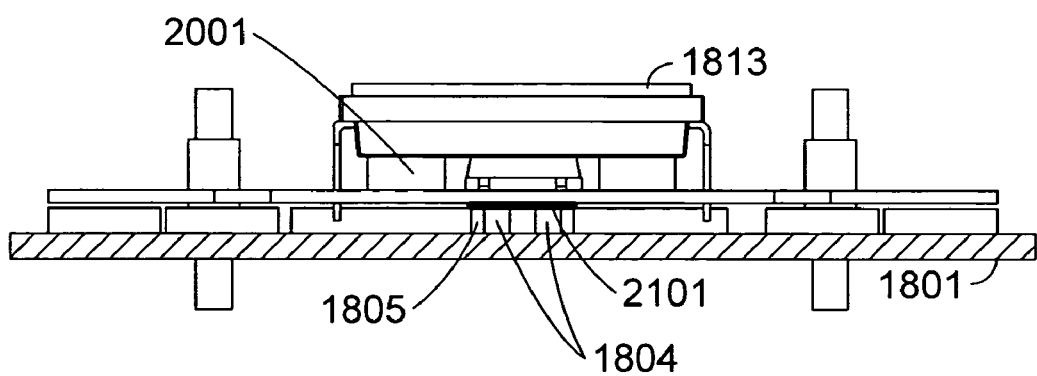

FIGS. 20 and 21 illustrate a technique for heat sinking sensor 1813 in the sensor mounting system of FIGS. 18 and 19. Heat conductor 2001 is placed between sensor 1813 and sensor mounting portion 1806. Heat conductor 2001 extends away from sensor mounting portion 1806 sufficiently far that it is in close contact with sensor 1813. Heat conductor 2001 is made of a thermally conductive material, preferably aluminum.

As shown in FIG. 21, a quantity of ferrofluid 2101 is placed between sensor mounting portion 1806 and sense magnet pairs 1804 and 1805. (Ferrofluid 1901 in the motor gaps is not shown in FIG. 21 so that ferrofluid 2101 is more readily visible.) A heat conduction path is thus provided for heat generated by the operation of sensor 1813. The heat can flow through heat conductor 2001, through sensor mounting portion 1806, through ferrofluid 2101, through sense magnet pairs 1804 and 1805, and into plate 1801, which serves as a thermal reservoir and facilitates the dissipation of the heat. A gap is provided between the magnets in sense magnet pairs 1804 and 1805 and sensor mounting portion 1806. Ferrofluid 2101 is attracted to the gap by the magnetic flux generated by sense magnet pairs 1804 and 1805, and does not substantially impede the motion of sensor mounting portion 1806 during image stabilization.

The invention claimed is:

1. A sensor mounting system for enabling image stabilization, comprising:
   a circuit carrier comprising a generally planar sensor mounting portion;
   an electronic array light sensor mounted on the circuit carrier sensor mounting portion;
   at least one linear motor that translates the circuit carrier sensor mounting portion in a direction generally parallel to the plane of the circuit carrier sensor mounting portion, wherein the at least one linear motor comprises a gap between a stator and a moving member of the at least one linear motor so that motion along X and Y axes is essentially free of static friction; and
   at least two flexible service loops that carry signals between circuitry on the circuit carrier sensor mounting portion and other circuitry, the other circuitry being stationary in relation to the stator of the motor,
   wherein the gap is substantially filled with a ferrofluid, the ferrofluid forming a fluid bearing that facilitates both the translation of the circuit carrier sensor mounting portion in the generally parallel direction and resisting motion of the circuit carrier sensor mounting portion in a direction generally perpendicular to the plane of the circuit carrier sensor mounting portion.

2. The sensor mounting system of claim 1, wherein the service loops emanate from the circuit carrier sensor mounting portion in locations that are approximately symmetrical about the center of mass of an assembly moved by the motor.

3. The sensor mounting system of claim 2, wherein the service loops enable the assembly to translate relatively freely in directions generally parallel to the plane of the circuit carrier sensor mounting portion, without inducing significant rotation of the assembly about an axis perpendicular to the plane of the circuit carrier sensor mounting portion.

4. The sensor mounting system of claim 1, wherein each service loop is a single-circuit-layer portion of a flex circuit.

5. The sensor mounting system of claim 1, wherein a larger flex circuit comprises the sensor mounting portion and the service loops.

6. The sensor mounting system of claim 1, wherein: the circuit carrier sensor mounting portion is a portion of a flex circuit that also comprises an other logic mounting portion and a connecting portion; a first pair of the service loops carries signals between the sensor mounting portion and the other logic mounting portion; and a second pair of service loops carries signals between the sensor mounting portion and the connecting portion.

7. The sensor mounting system of claim 6, wherein the other logic mounting portion and the connector portion are configured to connect to each other.

8. The sensor mounting system of claim 6, further comprising logic mounted on the connecting portion.

9. The sensor mounting system of claim 6, wherein critical signals relating to the electronic array light sensor are routed through the first pair of service loops.

10. A flexible circuit for sensor mounting, comprising:
a generally planar sensor mounting portion;
a ferrofluid in a gap between the sensor mounting portion and a stationary
portion of the sensor mounting portion; and
at least two flexible service loops that are single-circuit-layer portions of a flex circuit and carry signals between circuitry mounted on the sensor mounting portion and other circuitry, the service loops emanating from locations that are generally symmetrical about a center of the sensor mounting portion,
wherein when the other circuitry is held stationary, the service loops enable translation of the sensor mounting portion in directions generally parallel to the plane of the sensor mounting portion, without inducing significant rotation of the sensor mounting portion about an axis generally perpendicular to the plane of the sensor mounting portion, and wherein the ferrofluid forms a fluid bearing that facilitates both translation of the sensor mounting portion in the generally parallel direction and resists motion of the sensor mounting portion in a direction generally perpendicular to the plane of the sensor mounting portion.

11. The flexible circuit of claim 10, further comprising an other logic mounting portion, and wherein a first pair of the service loops carries signals between the sensor mounting portion and the other logic mounting portion.

12. The flexible circuit of claim 11, further comprising a connecting portion, and wherein a second pair of service loops carries signals between the sensor mounting portion and the connecting portion.

13. The flexible circuit of claim 12, wherein the other logic mounting portion and the connecting portion are configured to connect to each other.

14. A camera, comprising:
a circuit carrier comprising a generally planar sensor mounting portion;
an electronic array light sensor mounted on the circuit carrier sensor mounting portion;
a lens that projects a scene image onto the electronic array light sensor;
a ferrofluid in a gap between the circuit carrier sensor mounting portion and a stationary portion of the camera; and
at least two flexible service loops wherein each service loop is a single-circuit-layer portion of a flex circuit that carry signals between circuitry on the circuit carrier sensor mounting portion and other circuitry, the other circuitry being stationary in relation to the lens,
wherein the ferrofluid forms a fluid bearing that facilitates both translation of the circuit carrier sensor mounting portion in a generally parallel direction and resists motion of the sensor mounting portion in a direction generally perpendicular to the plane of the circuit carrier sensor mounting portion.

15. The camera of claim 14, wherein the service loops emanate from the circuit carrier sensor mounting portion in locations that are approximately symmetrical about the center of mass of a movable assembly comprising the electronic array light sensor.

16. The camera of claim 14, wherein the service loops enable the assembly to translate relatively freely in directions generally parallel to the plane of the circuit carrier sensor mounting portion, without inducing significant rotation of the assembly about an axis perpendicular to the plane of the circuit carrier sensor mounting portion.

17. The camera of claim 14, wherein a larger flex circuit comprises the sensor mounting portion and the service loops.

18. The camera of claim 14, wherein: the circuit carrier sensor mounting portion is a portion of a flex circuit that also comprises an other logic mounting portion; and a first pair of the service loops carries signals between the sensor mounting portion and the other logic mounting portion.

19. The camera of claim 18, wherein: the flex circuit further comprises a connecting portion; and a second pair of service loops carries signals between the sensor mounting portion and the connecting portion.

20. The camera of claim 19, wherein the other logic mounting portion and the connecting portion are configured to connect to each other.

21. The camera of claim 19, further comprising logic mounted on the connecting portion.

22. A method of mounting a sensor in a camera, comprising:
mounting an electronic array light sensor on a generally planar sensor mounting portion of a circuit carrier;
extending at least two service loops from the circuit carrier, the service loops carrying signals from the circuit carrier sensor mounting portion to other circuitry, wherein a gap is formed between the circuit carrier sensor mounting portion and the other circuitry so that motion along X and Y axes is essentially free of static friction;
placing ferrofluid in the gap, the placed ferrofluid forming a fluid bearing that both facilitates the essentially static friction free motion of the circuit carrier sensor mounting portion along X and Y axes and facilitates resistance to motion of the circuit carrier sensor mounting portion in an axis generally perpendicular to a plane of the circuit carrier sensor mounting portion; and
bending the service loops such that, when the other circuitry is held stationary, the service loops enable relatively unimpeded motion of the circuit carrier generally parallel to the plane of the circuit carrier, without inducing significant rotation of the circuit carrier about an axis generally perpendicular to the circuit carrier.

23. The method of claim 22, wherein the service loops are single-circuit-layer flex circuits.

24. The method of claim 22, wherein a larger flex circuit comprises the sensor mounting portion and the service loops.

* * * * *

UNITED STATES PATENT AND TRADEMARK OFFICE
CERTIFICATE OF CORRECTION

PATENT NO.         : 7,679,647 B2                                                      Page 1 of 1
APPLICATION NO.    : 10/896470
DATED              : March 16, 2010
INVENTOR(S)        : Donald J. Stavely et al.

It is certified that error appears in the above-identified patent and that said Letters Patent is hereby corrected as shown below:

In column 15, lines 27-28, in Claim 10,
delete "and a stationary
            portion of the sensor mounting portion; and"
and insert -- and a stationary portion of the sensor mounting portion; and --, therefor.

Signed and Sealed this

Twenty-seventh Day of July, 2010

David J. Kappos
*Director of the United States Patent and Trademark Office*